United States Patent
Reilich et al.

(10) Patent No.: US 6,271,048 B1
(45) Date of Patent: Aug. 7, 2001

(54) PROCESS FOR RECYCLING A SUBSTRATE FROM AN INTEGRATED CIRCUIT PACKAGE

(75) Inventors: Kenneth Patrick Reilich, Ramona; Ronald Allen Norell, Oceanside; Elvira Widyani Preecha, San Diego; Joel Elwood Wing; Lorraine Lo-Lan Wing, both of Escondido, all of CA (US)

(73) Assignee: Unisys Corporation, Blue Bell, PA (US)

( * ) Notice: Subject to any disclaimer, the term of this patent is extended or adjusted under 35 U.S.C. 154(b) by 0 days.

(21) Appl. No.: 09/693,428

(22) Filed: Oct. 20, 2000

(51) Int. Cl.$^7$ .............................. H01L 21/66; H01L 21/44
(52) U.S. Cl. .......................... 438/14; 438/105; 438/106; 438/117
(58) Field of Search .............................. 438/14, 105, 106, 438/107, 117; 257/786, 787, 779; 228/264, 102, 104

(56) References Cited

U.S. PATENT DOCUMENTS

| | | | |
|---|---|---|---|
| 5,170,929 | * 12/1992 | Long et al. | 228/102 |
| 5,478,009 | * 12/1995 | Interrante et al. | 228/264 |
| 5,782,403 | * 7/1998 | Wang | 228/264 |
| 5,892,290 | * 4/1999 | Chakravority et al. | 257/786 |
| 6,134,776 | * 10/2000 | Hoffmeyer | 438/119 |

FOREIGN PATENT DOCUMENTS

| | | |
|---|---|---|
| 36203318 | * 2/1987 | (JP) . |
| 363104438 | * 5/1988 | (JP) . |
| 403151641 | * 6/1991 | (JP) . |
| 403169012 | * 7/1991 | (JP) . |
| 404075332 | * 3/1992 | (JP) . |

* cited by examiner

Primary Examiner—Michael S. Lebentritt
(74) Attorney, Agent, or Firm—Charles J. Fassbender; Mark T. Starr; Lisa A. Rode

(57) ABSTRACT

An integrated circuit package is processed by a grinding step, a dissolving step, and a disintegrating step. The grinding step grinds an IC-chip completely off of a substrate, and it also grinds a first portion of a filler layer and a first portion of a set of solder balls which attach the IC-chip to the substrate. This leaves a partial filler layer and partial solder balls on the substrate. The dissolving step dissolves the partial filler layer off of the substrate after the grinding step; and the disintegration step disintegrates at least part of each partial solder ball by subjecting the partial solder balls on the substrate to ultrasonic vibration after the dissolving step. These steps leave the substrate with small solder mounds that can be easily attached to another IC-chip with another set of solder balls.

13 Claims, 10 Drawing Sheets

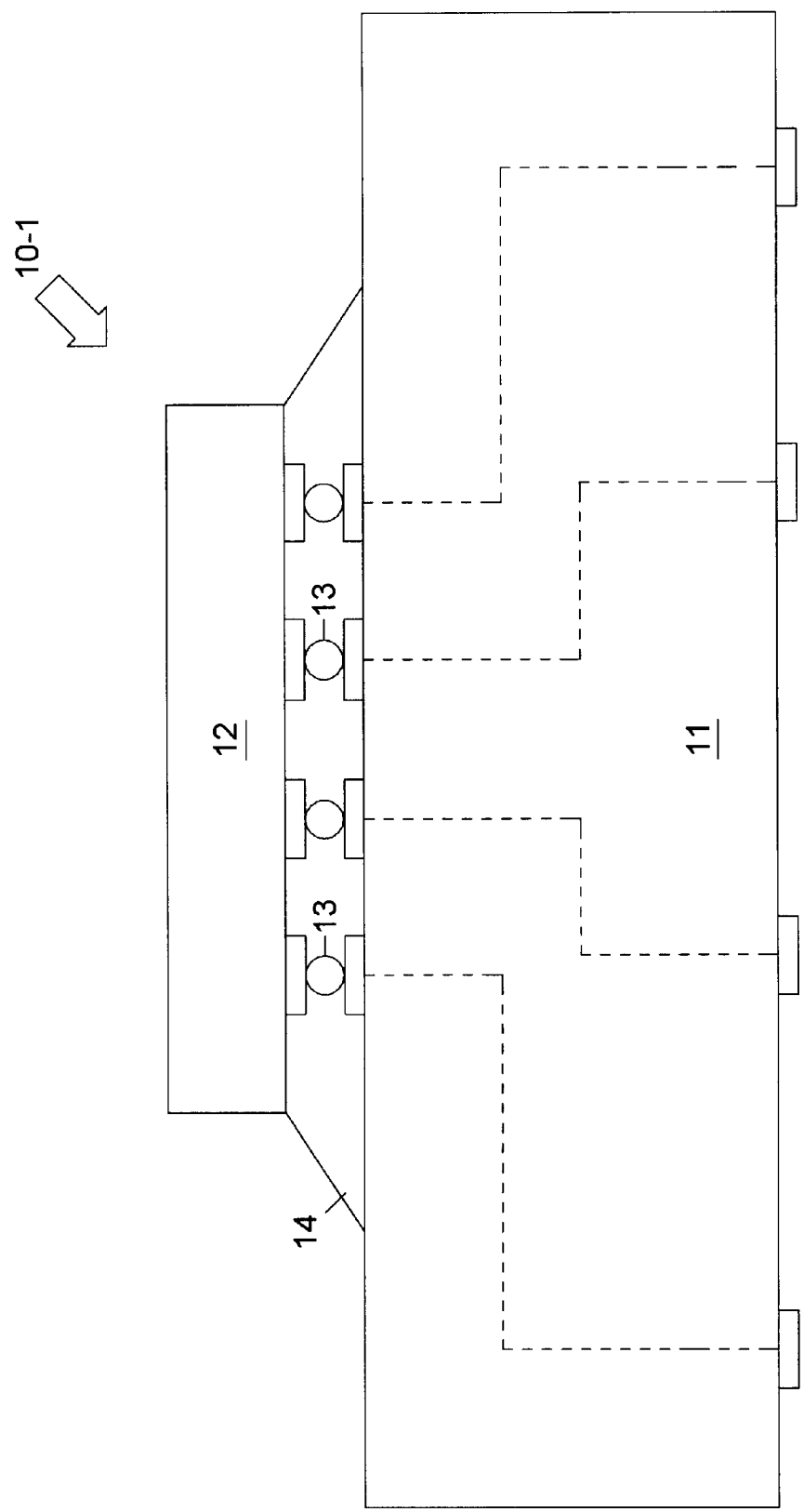

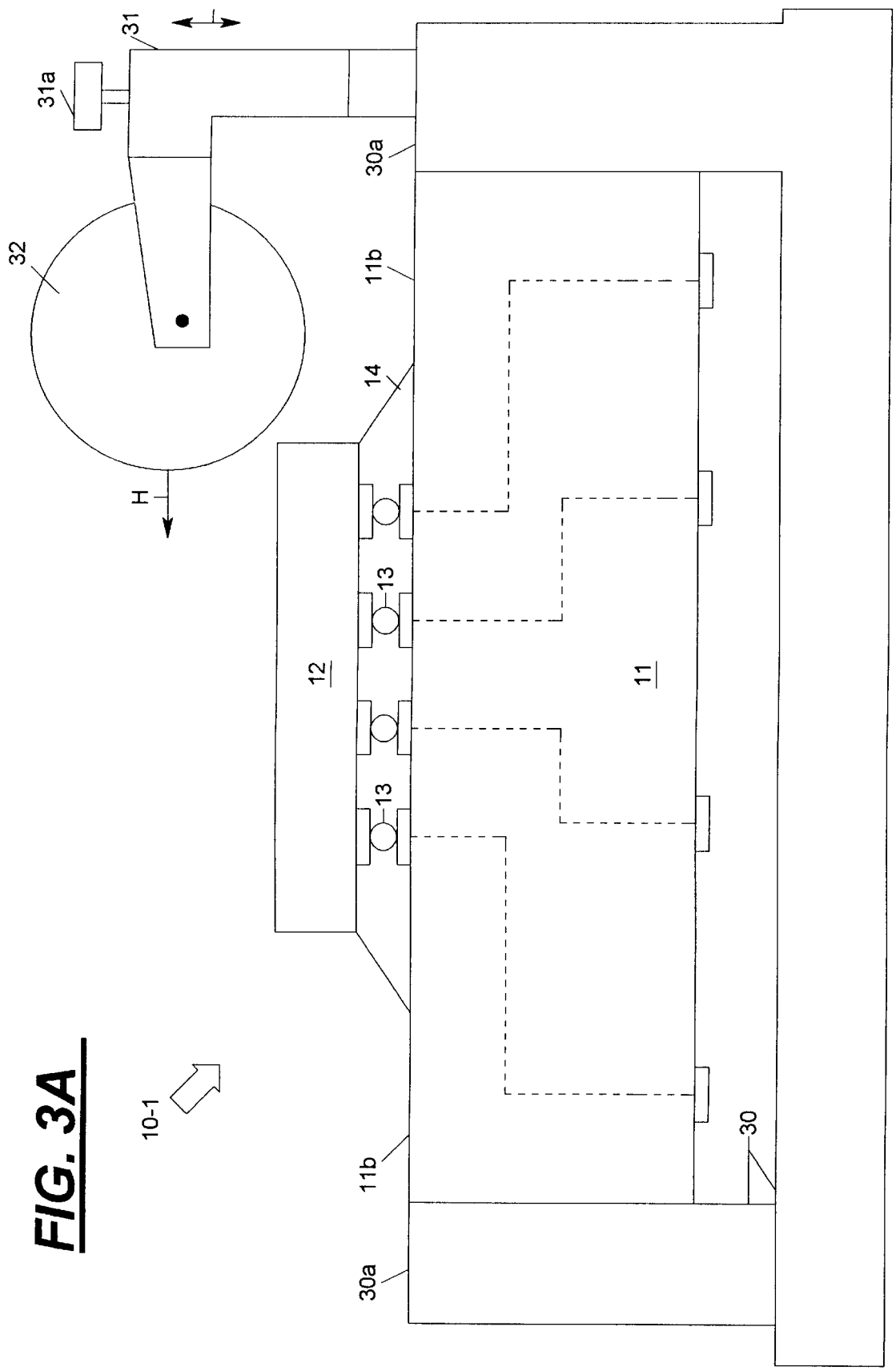

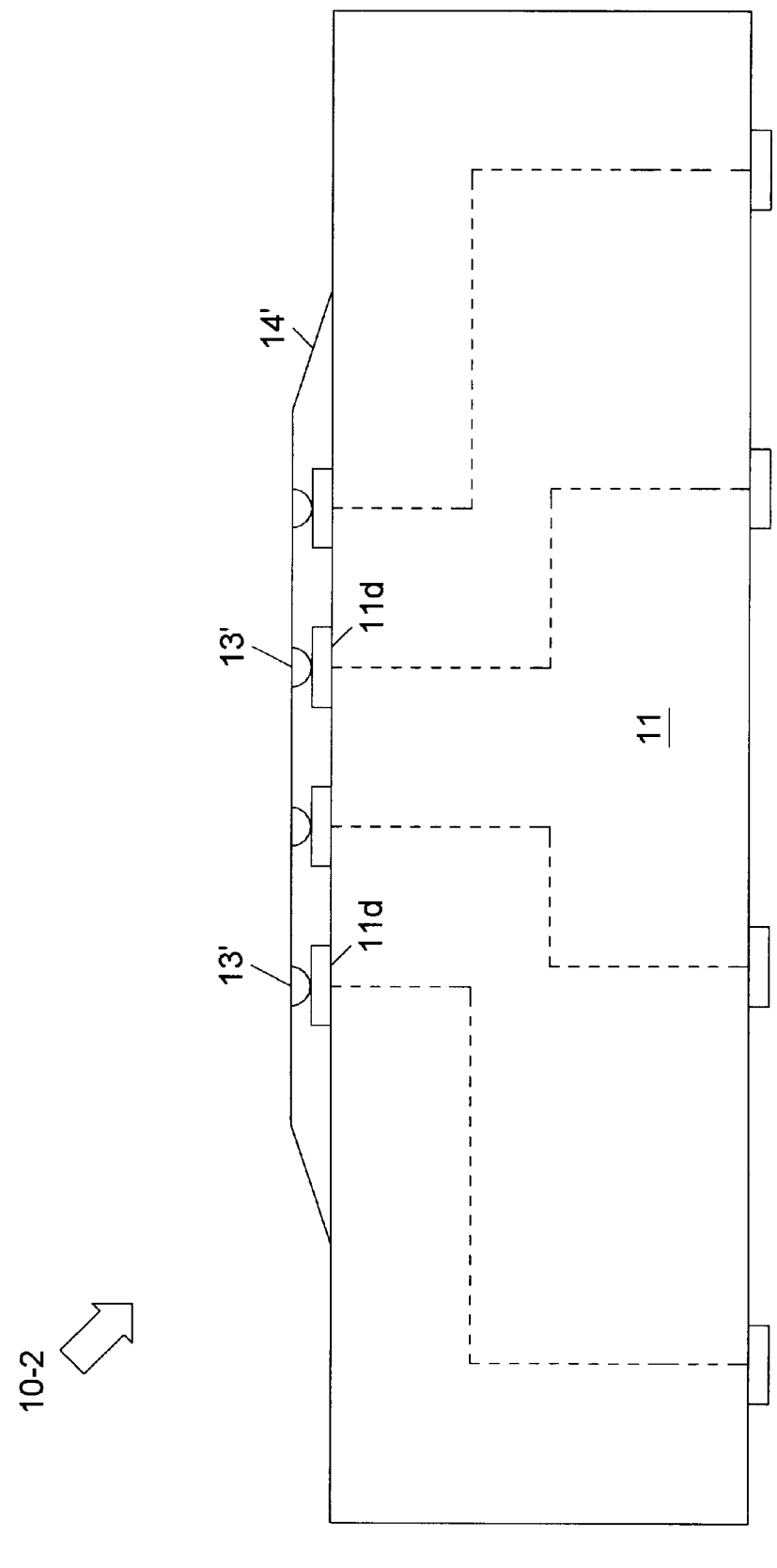

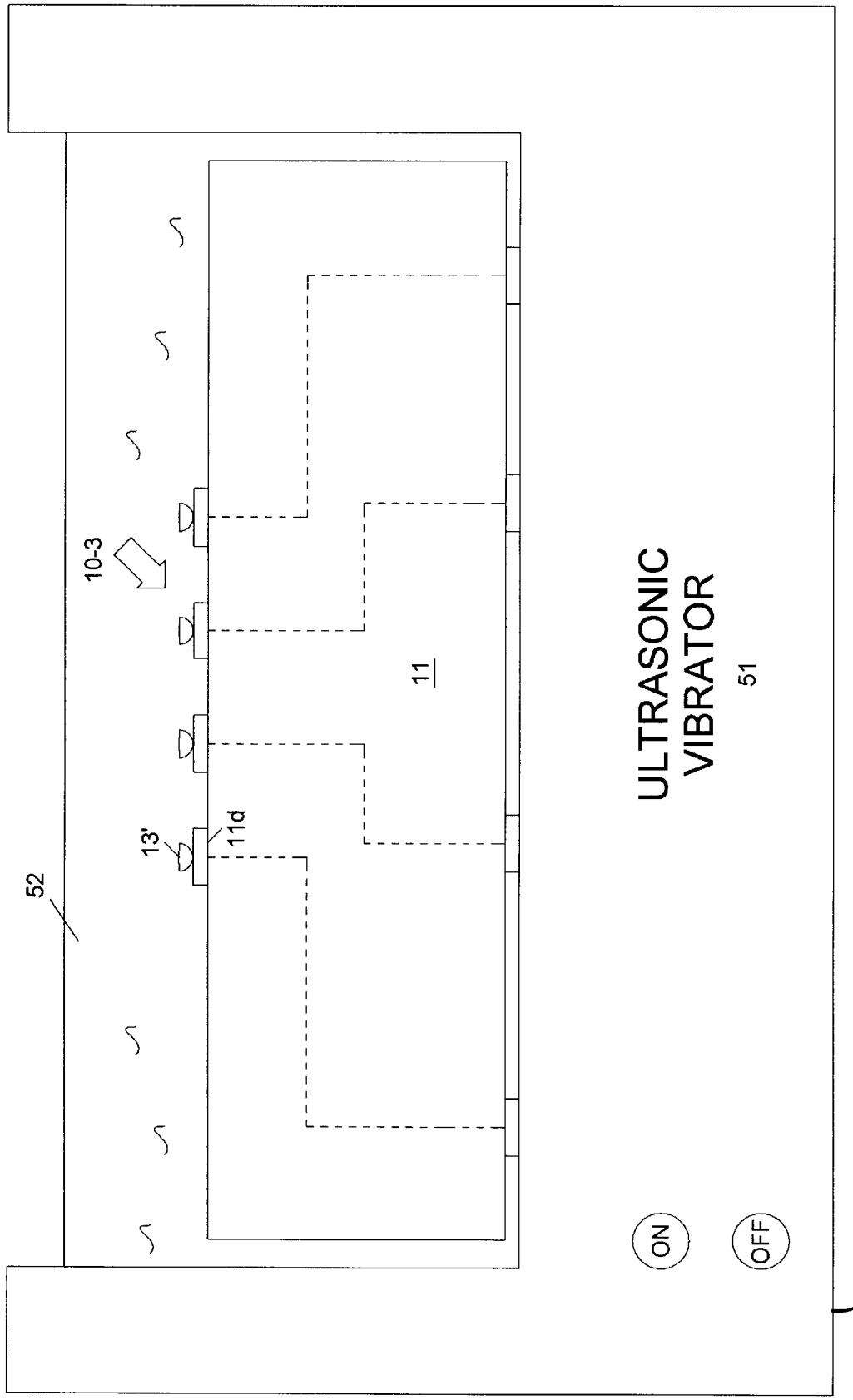

PROCESS FOR RECYCLING A SUBSTRATE FROM AN INTEGRATED CIRCUIT PACKAGE

BACKGROUND OF THE INVENTION

This invention relates to integrated circuit packages (IC-packages); and more particularly, this invention relates to processes for recycling substrates which are integrated into the IC-packages.

Throughout the history of the integrated circuit industry, a common practice has been to enclose integrated circuit chip (IC-chip) in an IC-package. Typically, the IC-package includes a substrate to which an IC-chip is attached by multiple solder balls and a filler layer, and a lid which covers the IC-chip and is sealed onto the substrate. Such an IC-package protects the enclosed IC-chip, which is very delicate, from being damaged.

Also in the prior art, a common practice is to build multi-chip assemblies by interconnecting several different IC-chips on a printed circuit board, where each IC-chip is enclosed in its own IC-package. The substrate in each IC-package includes a plurality of I/O terminals; and electrical signals are sent to and received from the IC-chip which is enclosed in the IC-package thru these I/O terminals.

In order to transfer the electrical signals from the I/O terminals on the substrate to the enclosed IC-chip, the substrate includes patterned electrical conductors which run from the I/O terminals to the enclosed IC-chip. The total number of conductors in the substrate can range widely, depending upon the complexity of the IC-chip that is enclosed.

Today, a single IC-chip often sends and receives over 1,000 signals in parallel. Consequently, the corresponding substrate in an IC-package which holds such an IC-chip must contain over 1,000 conductors. These conductors are microscopic in their size; and thus, the structure of the substrate is quite complex.

When an IC-chip in an IC-package becomes defective or obsolete, the conventional practice in the prior art is to replace the entire IC-package with a new IC-chip in a new IC-package. The original IC-package is simply thrown away in its entirety; or sometimes, any precious metal (such as gold) in the original IC-package is recovered.

However, the package which contains the defective or obsolete IC-chip usually contains a substrate which is completely operable; and that substrate can be quite expensive if the number of interconnections which it provides is large. Thus, when any mass produced product contains defective or obsolete IC-chips, the value of the substrates which hold those IC-chips can easily exceed one million dollars. But, in order to remove the lid and the IC-chip and the filler layer and the solder balls from the substrate in a cost effect manner without causing any damage to the substrate, many detailed technical problems need to be overcome.

For example, if the IC-chip together with the filler layer is simply pulled off of the substrate, then some of the conductors can also be pulled off of the substrate. Also, if the solder balls are simply melted off of the substrate, then atoms of the melted solder can diffuse into the conductors in the substrate to thereby form inter-metallic compounds with the conductors that are brittle and can fracture. Further, if all of the solder balls are removed by any means in their entirety from the substrate, then the remaining bare conductors on the substrate can chemically react with the atmosphere to form oxides which prohibit the conductors from being reattached to another IC-chip.

Accordingly, a primary object of the present invention is to provide a novel cost effective process for recycling a substrate from an IC-package by which the above-described technical problems, and others, are avoided.

BRIEF SUMMARY OF THE INVENTION

The present invention is a process for recycling a substrate from an IC-package. One particular IC-package to which the present invention can be applied includes—a) substrate that has microscopic conductors that connect to a plurality of I/O pads, b) an IC-chip that is spaced-apart from the substrate and has a plurality of I/O pads that are aligned with the I/O pads on the substrate, c) respective solder balls that connect the I/O pads on the substrate to the I/O pads on the IC-chip, and d) a filler layer that fills the space between the substrate and the IC-chip and the solder balls.

In accordance with one version of the present invention, the above type of IC-package is processed by a grinding step, a dissolving step, and a disintegrating step. The grinding step grinds off of the substrate, the IC-chip in its entirety plus a first portion of the filler layer and a first portion of each solder ball to thereby leave a partial filler layer and partial solder balls on the substrate. The dissolving step dissolves the partial filler layer off of the substrate after the grinding step. And, the disintegration step disintegrates at least part of each partial solder ball by subjecting the partial solder balls on the substrate to ultrasonic vibration after the dissolving step.

When the above steps are performed, none of the microscopic conductors which are in the substrate are pulled off the substrate. Also when the above steps are performed, no solder in the solder balls is melted, and thus no significant diffusion of solder occurs into the substrate conductors. Further when the above steps are performed, small solder mounds are left on each conductor in the substrate by terminating the disintegrating step after a predetermined time interval; and consequently, no oxides are formed by the atmosphere on the substrate conductors.

BRIEF DESCRIPTION OF THE DRAWINGS

FIG. 2C shows a subassembly which is produced by the steps of FIGS. 2A and 2B.

FIG. 3A shows a grinding step that is performed, in the present invention, on the subassembly of FIG. 2B.

FIG. 3B shows a second subassembly that is produced by the grinding step of FIG. 3A.

FIG. 5A shows a disintegrating step that is performed, in the present invention, on a plurality of partial solder balls that are in the third subassembly of FIG. 4B.

DETAILED DESCRIPTION

Figure 1:
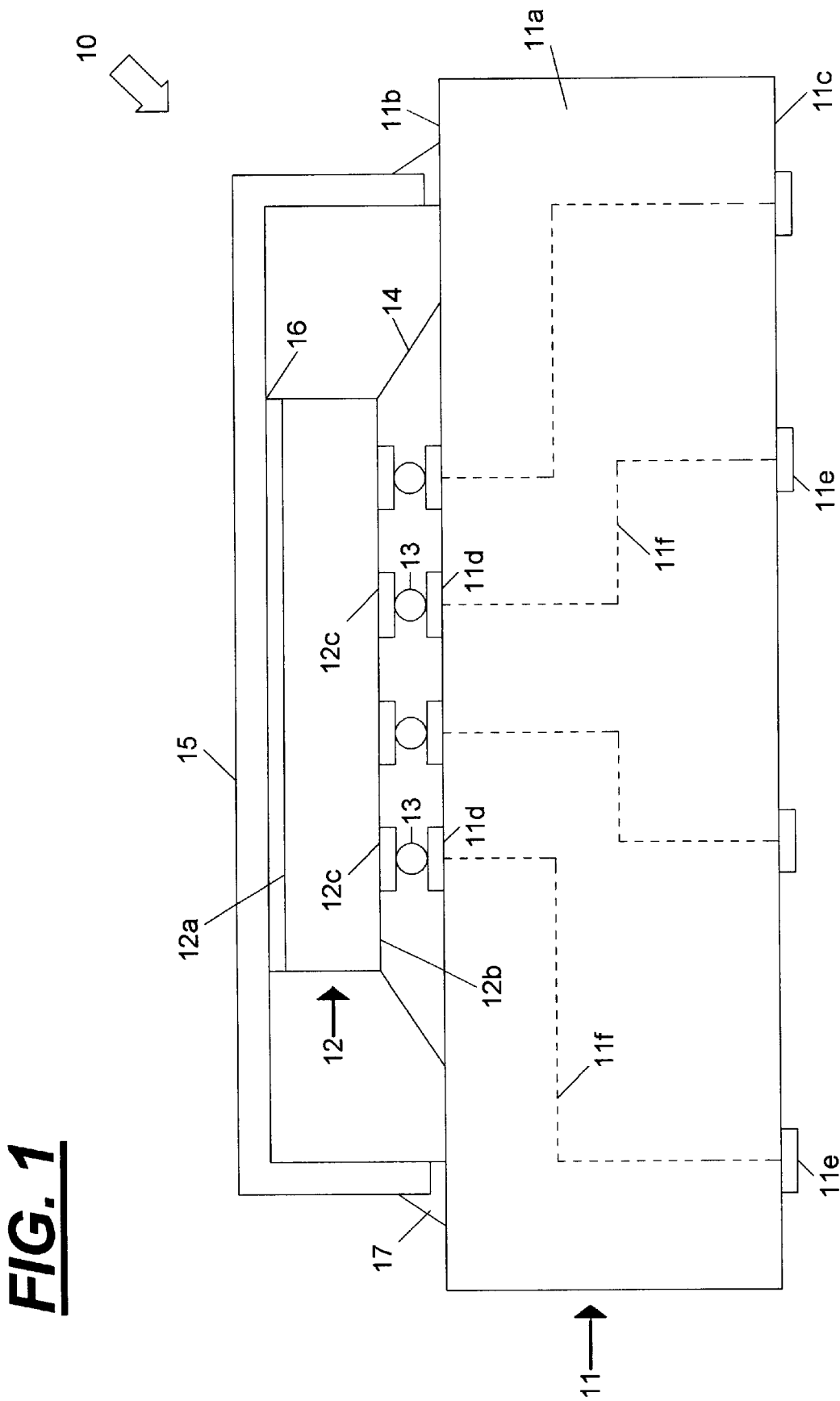
FIG. 1. shows an IC-package which includes a substrate that can be removed from the IC-package and recycled, by a process which utilizes the present invention.

One particular integrated circuit package 10 (IC-package 10) which includes a substrate 11 that can be recycled in accordance with the present invention, will now be described in detail in conjunction with FIG. 1. This IC-package 10 is comprised of components 11–17 which are interconnected as shown, and these components 11–17 are identified below in TABLE 1.

TABLE 1

| Component | Description |
| --- | --- |
| 11 | Component 11 is a substrate which includes a rectangular ceramic block 11a that has a top face 11b and a bottom face 11c. A plurality of metal I/O pads 11d are integrated onto the top face 11b, and a corresponding plurality of metal I/O pads 11e are integrated onto the bottom face 11c. Patterned conductors 11f in the ceramic block 11a interconnect the I/O pads 11d to the I/O pads, 11e. |
| 12 | Component 12 is an integrated circuit chip (IC-chip) that has a top face 12a and a bottom face 12b. A plurality of metal I/O pads 12c are integrated onto the bottom face 12b. |
| 13 | Component 13 is a plurality of solder balls that interconnect the I/O pads 11d on the ceramic substrate 11 to the I/O pad 12c on the IC-chip 12. |
| 14 | Component 14 is a filler layer which fills the space between face 11b of the substrate 11, face 12b of the IC-chip 12, and the solder balls 13. |
| 15 | Component 15 is a lid which covers the IC-chip 12. |
| 16 | Component 16 is a thermal "grease" which fills a gap between the lid 15 and face 12a of the IC-chip 12. By a thermal grease is herein meant any pliable material which has a high thermal conductivity. |
| 17 | Component 17 is a sealant which seals the lid 15 to face 11b of the substrate 11. |

For the purpose of simplifying FIG. 1, the IC-chip 12 is illustrated as having only four I/O pads 12c that are connected to four solder bumps 13; whereas an actual IC-chip can have over one-thousand I/O pads that are connected to respective solder bumps. Also, to enhance the visibility of all of the components 11–17 in FIG. 1, the components are not drawn to scale. For example, an actual IC-chip 12 typically is only ten to twenty millimeters long on each side and only about one-half to one millimeter thick; and an actual solder ball 13 typically is only about three to four mils in diameter.

Now, with reference to FIGS. 2A thru 5C, a process will be described which removes the substrate 11 from the IC-package 10 of FIG. 1 such that substrate 11 is undamaged and can be reattached to another IC-chip. This process of FIGS. 2A thru 5C constitutes one preferred embodiment of the present invention.

Figure 2A:
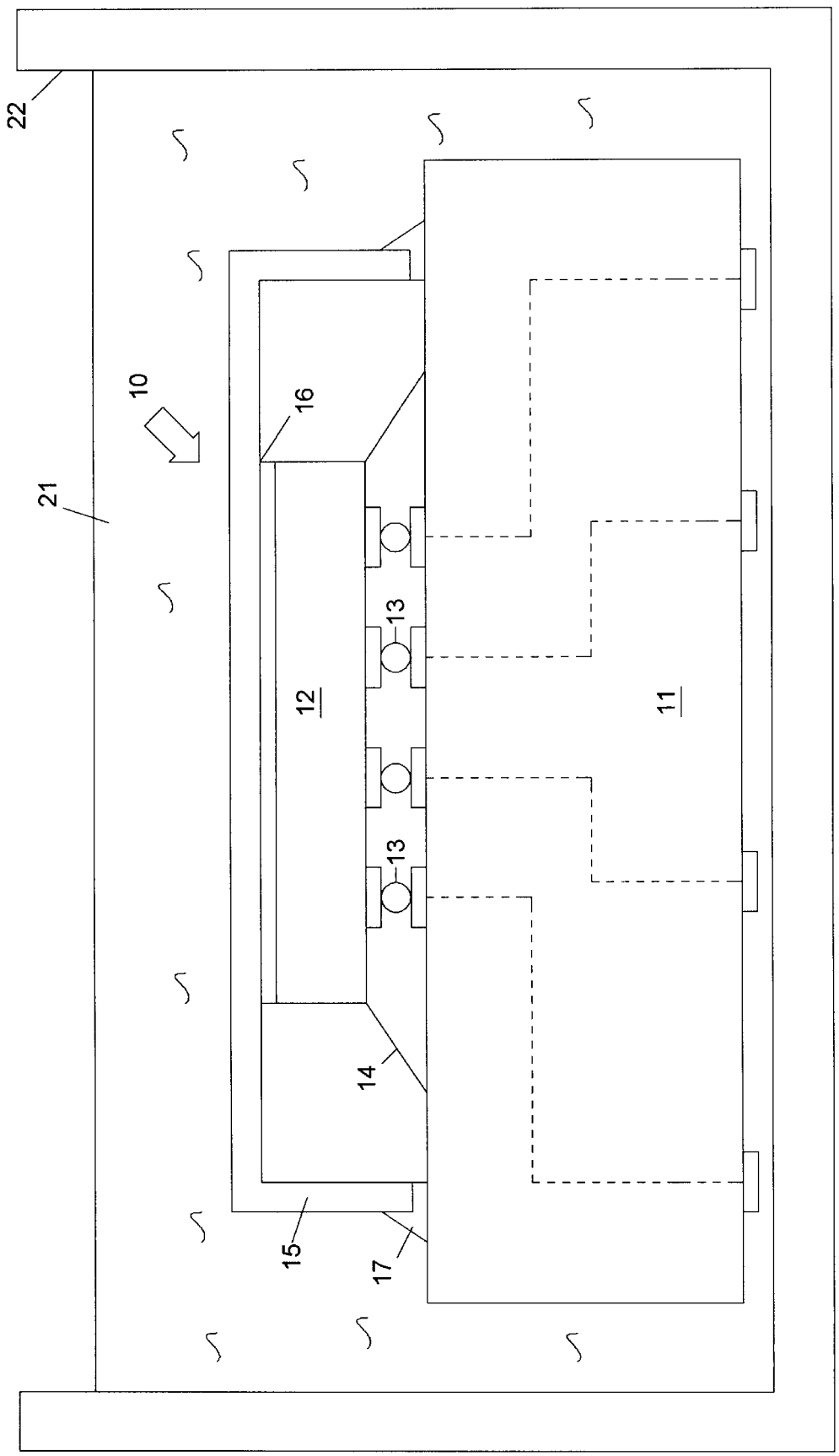
FIG. 2A shows how the IC-package of FIG. 1 is processed by one particular step in the present invention, which weakens a seal between a lid and the substrate in the IC-package.

Initially, as is shown in FIG. 2A, the IC-package 10 is soaked in a liquid solvent which weakens, but does not penetrate, the seal that connects the lid 15 to the substrate 11. In FIG. 2A, the liquid solvent is identified by reference numeral 21, and that solvent completely covers the IC-package 10 in a container 22. One particular sealant 17 for the IC-package 10 is Sylgard 577; and to weaken that sealant without penetrating the seal, the IC-package 10 can be soaked in Dynaloy Dynasolve 255 for a period of six to twenty-four hours.

In performing the soaking step of FIG. 2A, it is important that the liquid solvent 21 does not pass thru the sealant 17 and thereby cause problems with any of the components 12, 14 and 16 which are protected by the lid 15. For example, if the solvent 21 contacts the thermal grease 16, that grease could become smeared all over the substrate 11 and the filler layer 14. To completely clean-up all of that smeared grease would require extra processing steps and might damage the substrate 11.

Figure 2B:
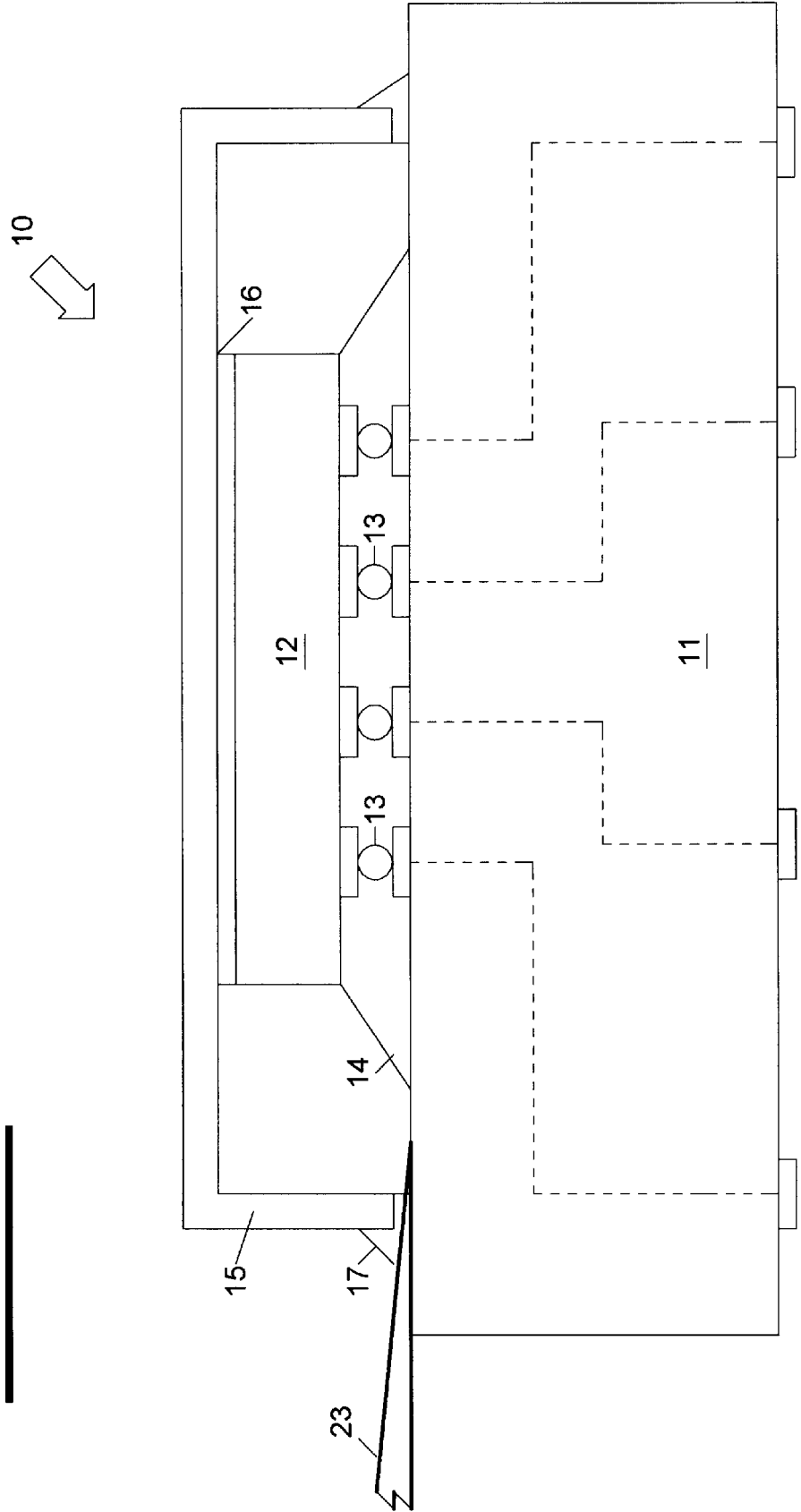
FIG. 2B shows how the lid-to-substrate seal, in the IC-package of FIG. 1, is cut by another step in the present invention, after the seal weaking step of FIG. 2A.

Following the soaking step of FIG. 2A, the IC-package 10 is removed from the liquid solvent 21, rinsed in isopropyl alcohol, and dried. Thereafter, a blade 23 is used to cut through the sealant 17 as is illustrated in FIG. 2B. This blade 23 can, for example, be a razor blade.

After the sealant 17 has been cut completely around the lid 15, that lid is manually removed from the substrate 11. Then, the thermal grease 16 is removed from face 12a of the IC-chip 12 by rubbing that face with a high quality foam tip cleaner which is suitable for use in a clean-room environment.

By performing the steps of FIGS. 2A and 2B, a subassembly 10-1 is formed, as is shown in FIG. 2C. One desirable feature of this subassembly 10-1 is that the sealant 17 and the lid 15 and the thermal grease 16 have been removed without cracking, chipping, or any other damage occurring to the substrate 11. Further in the subassembly 10-1, face 11b of the substrate 11 is clean enough to be reattached without leaks to another lid 15.

Next, a grinding step is performed on the subassembly 10-1; and this grinding step is illustrated in FIG. 3A. There, the substrate 11 is held by its sides in a chuck 30 such that face 11b on the substrate is aligned with a face 30a on the chuck. Also attached to the chuck 30 is a moveable arm 31 which holds a grinding wheel 32 that is rotated by an electric motor (not shown). This grinding wheel 32 is manually positioned in a vertical direction V, relative to face 30a on the chuck, by a knob 31a on the arm 31.

In operation, the grinding wheel 32 is used to grind the IC-chip 12 completely off of the subassembly 10-1, and to also grind a portion of the filler layer 14 plus a portion of each solder bump 13 from the subassembly 10-1. To perform this grinding step, the grinding wheel 32 is sequentially moved closer and closer to surface 30a in several small increments; and at each position, the grinding wheel is passed in the horizontal direction H through the IC-chip 12 and/or the solder balls 13 plus the filler layer 14.

By the above grinding step, a new subassembly 10-2 is formed as shown in FIG. 3B. There, the partial filler layer 14' which remains on the substrate 11 has an average thickness of only about one mil. Likewise, the partial solder balls 13' which remain on the substrate 11 plus their corresponding I/O pads 11d have a combined average thickness of only about one mil.

Figure 4A:
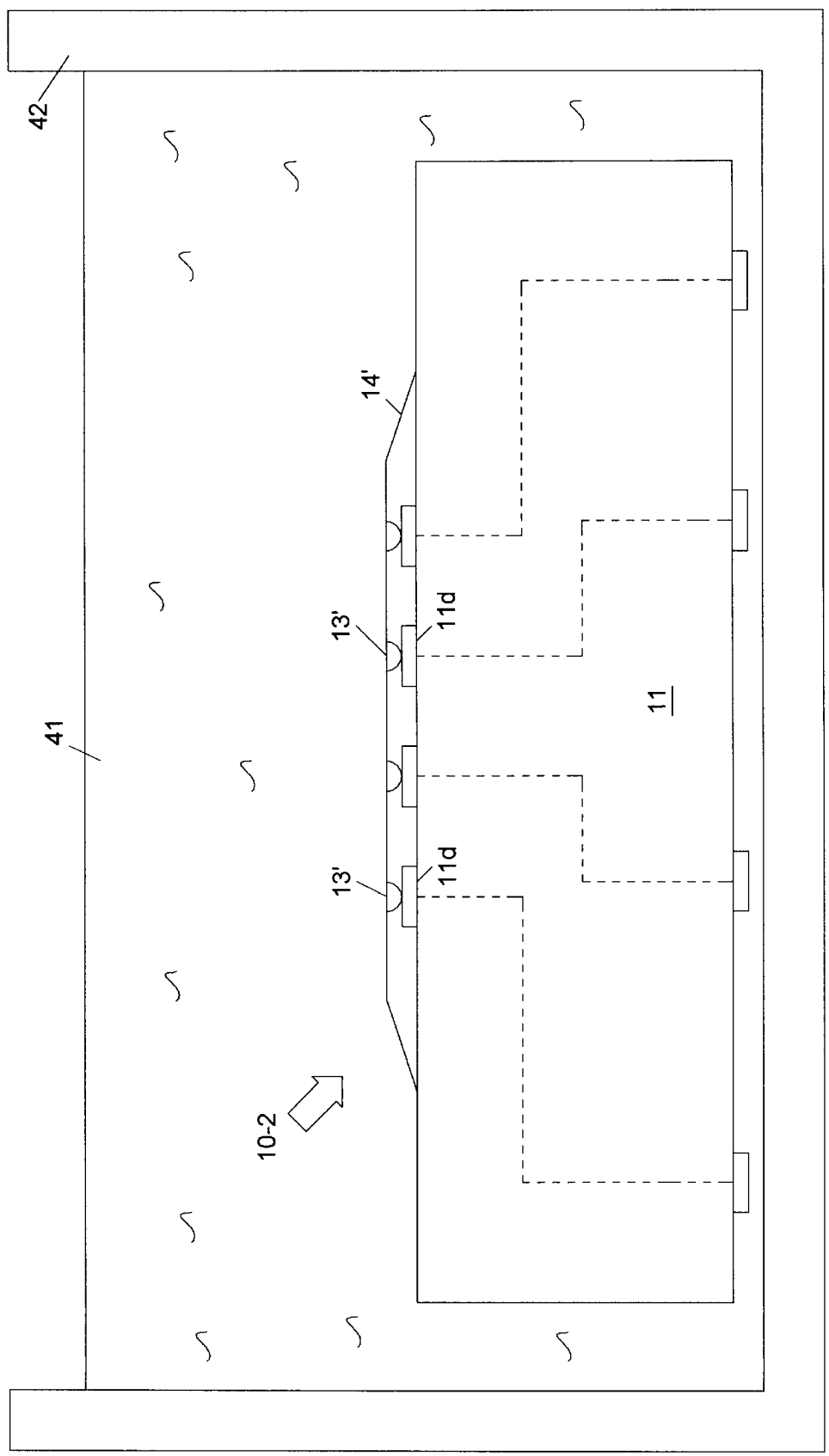
FIG. 4A shows a dissolving step that is performed, in the present invention, on a partial filler layer which is in the second subassembly of FIG. 3B.

Next, a dissolving step is performed to remove the partial filler layer 14' from the subassembly 10-2; and this is illustrated in FIG. 4A. To perform this dissolving step, the subassembly 10-2 is covered with a liquid solvent 41 which is held by a container 42. This solvent 41 is selected to chemically react with just the partial filler layer 14' and not with the partial solder balls 13' or the substrate 11.

In one particular module, the filler layer 14 was a mixture of silica particles and an epoxy binder; and in another particular module, the filler layer 14 was a mixture of silica particles and an cyanate ester binder. In each of those modules, the binder was dissolved by the solvent 41 of Dynaloy Dynasolve 2000. To completely dissolve all of that binder in the partial filler layer 14' having an average thickness of one-mil takes about twenty minutes at a temperature of 160° C. to 180° C.

Figure 4B:
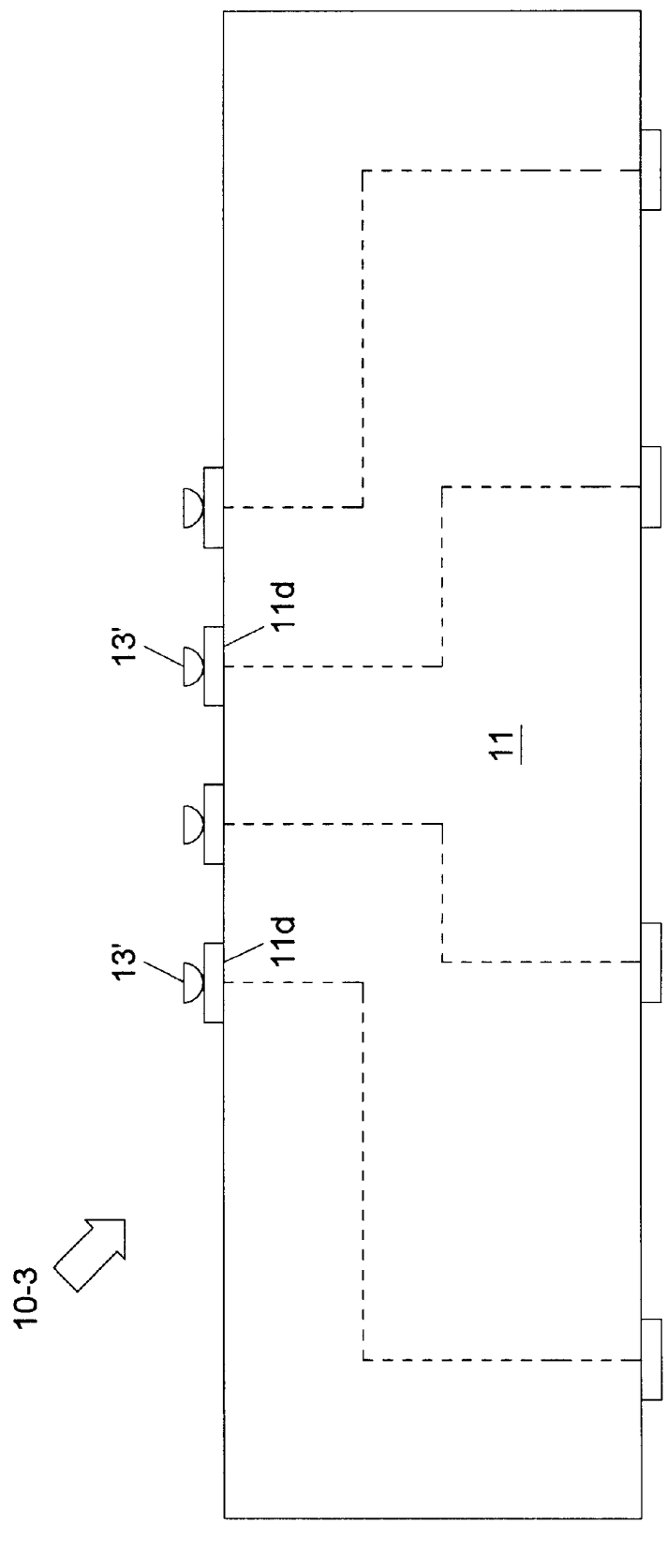
FIG. 4B shows a third subassembly that is produced by the dissolving step of FIG. 4A.

By performing the dissolving step of FIG. 4A, a new subassembly 10-3 is formed as shown in FIG. 4B. That subassembly 10-3 consists, in its entirety, of the substrate 11 and the partial solder balls 13' which are attached to the I/O pads 11d on the substrate 11.

Figure 5B:
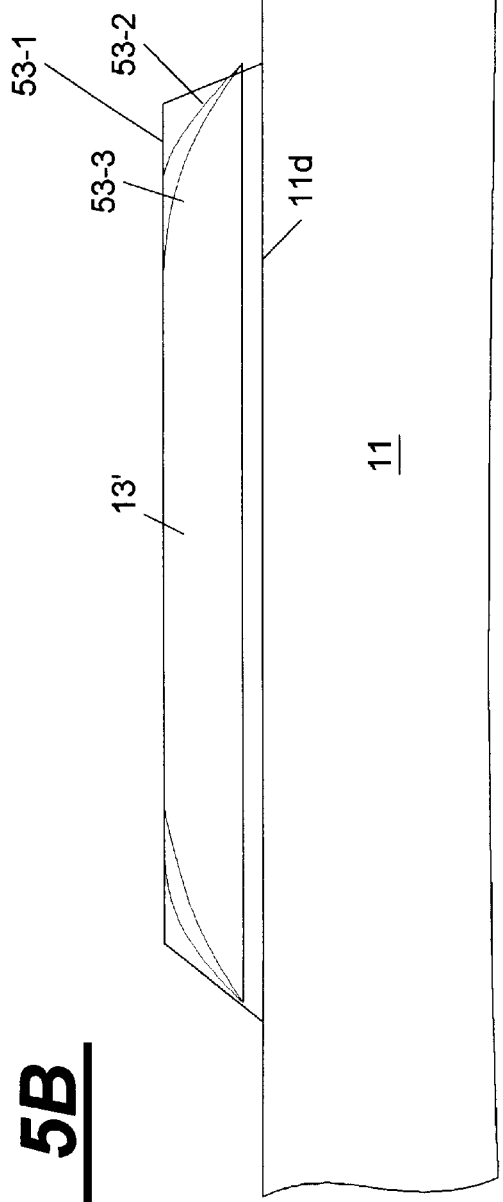
FIG. 5B shows how one partial solder ball gets progressively smaller during the disintegrating step of FIG. 5A.
Figure 5C:
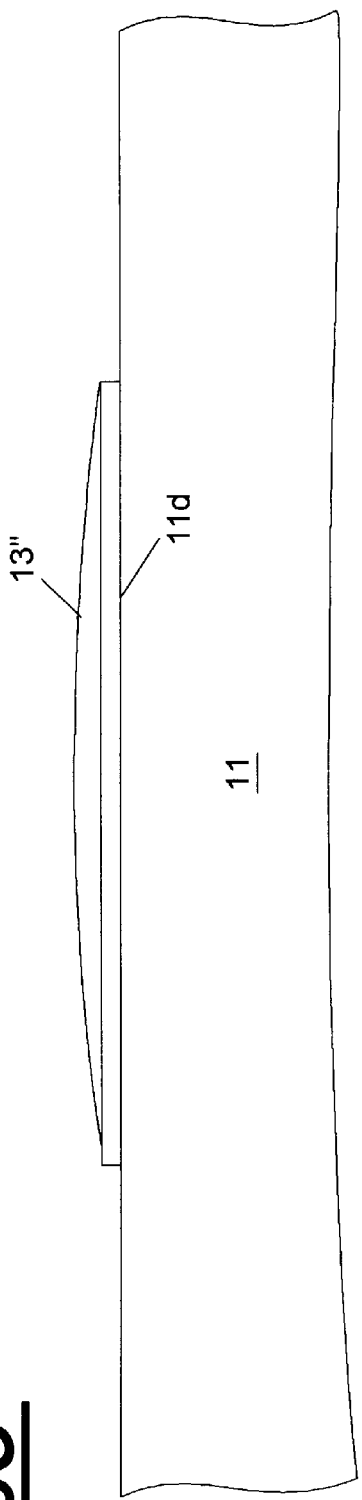
FIG. 5C shows a small solder mound which is obtained from one partial solder ball, by completing the disintegrating step of FIG. 5A.

Next, a disintegrating step is performed to remove the partial solder balls 13' from the subassembly 10-3; and this step is illustrated in FIGS. 5A–5C. This disintegrating step is performed by placing the subassembly 10-3 in an ultrasonic vibrator 51, covering the subassembly 10-3 with de-ionized water 52 in the vibrator 51, and then subjecting the subassembly 10-3 to ultrasonic vibrations by running the vibrator 51 for a predetermined time interval.

Due to the ultrasonic vibrations from the vibrator 51, microscopic particles of solder disintegrate off of the surface of each partial solder ball 13'. The present co-inventors believe, that these microscopic particles disintegrate along various grain boundaries in the partial solder ball 13', although this has not yet been rigorously proven. In any case, the amount of solder which remains attached to its respective I/O pad 11d becomes progressively smaller and smaller as the vibrating step proceeds.

The above disintegrating of solder from each partial solder ball 13' is illustrated in detail in FIG. 5B. There, the lines 53-1 show the surface of one partial soldered ball 13' immediately before the ultrasonic vibrator 51 is turned on. Then, while the ultrasonic vibrator 51 is running, the partial solder ball 13' is progressively reduced in size as shown by the lines 53-2, 53-3, etc. This disintegrating step of FIG. 5B is continued until each of the partial solder balls 13' is reduced to a much smaller solder mound 13" as shown in FIG. 5C. This phenomena of being able to progressively reduce the size of the partial solder balls 13' is quite surprising because the conventional use of ultrasonic vibration, in the integrated circuit in industry, is to merely clean and de-grease various electronic components.

In one particular integrated circuit module 10, the solder balls 13 consisted of an alloy of 97% lead and 3% tin. For that particular module, the partial solder balls 13' were reduced to the much smaller solder mound 13" by using a model B-22-4 vibrator from Branson Ultrasonics corporation. That vibrator has a power input of 125 watts; and to produce the solder mounds 13", the vibrator was run for thirty minutes.

One desirable feature of the above-described disintegrating step is that it can be performed at low temperatures where no significant molecular diffusion occurs. Typically, each I/O pad 11d is made of several microscopically thin layers of different metals; and at high temperatures, those metals can diffuse with the solder to form inter-metallic compounds that are undesirable. For example, any nickel in the I/O pads 11d can combine with tin in the partial solder balls 13' to form a nickel-tin compound which is brittle and can easily crack. However, the formation of these inter-metallic compounds is avoided by the disintegrating step of FIG. 5A since that step can be carried out at low temperatures, such as room temperature.

After all of the steps of FIGS. 3A–5C have been performed, the substrate 11 with the small solder mounds 13" can be incorporated into another copy of the FIG. 1 IC-package 10. To do that, a subassembly is first formed in which a new set of solder balls 13 is attached to the I/O pads 12c of a new IC-chip 12. Then, the solder balls 13 on that subassembly are aligned with and placed on the solder mounds 13" which are on the substrate 11. Thereafter, the solder balls 13 and the solder mounds 13" are fused together by a solder reflow step. Then, to complete the module 10, the filler layer 14 is added between the IC-chip 12 and the substrate 11; thermal grease 16 is put on surface 12a of the IC-chip 12; and the lid 16 is attached to the substrate 11 by the sealant 17.

One preferred process for recycling a substrate 11 in an IC-package 10 has now been described in detail. Now, several changes and modifications will be described which can be made to the details of the above-described process without departing from the nature and spirit of the invention.

As one modification, the disintegrating step of FIG. 5A can be performed for such a long time period that all of the solder in the partial solder balls 13' is disintegrated off of the I/O pads 11d on the substrate 11. However, after that is done, the bare I/O pads 11d can react with the surrounding atmosphere and thereby form oxides on the surface of the I/O pads which hinders their reattachment to the solder balls on a new IC-chip. Such oxides can be removed prior to the reattachment process; however, that involves extra processing steps.

Thus, in the illustrated process, the disintegrating step of FIG. 5A is terminated when the structure of FIG. 5C is reached. Preferably, the solder mound 13" of FIG. 5C has only one-quarter to one-tenth the amount of solder that is in the partial solder ball 13' of FIG. 5B. By leaving such a small amount of solder, the peaks of all of the solder mounds 13" on all of the I/O pads 11d lie essentially in a single plane; and that is a desirable feature which aids in the process of reattaching a new IC-chip with a new set of solder balls to the solder mounds 13".

As a second modification, the amount of the filler layer 14 and solder balls 13 which are removed from the subassembly 10-1 by the grinding step of FIG. 3A can be adjusted up or down. In the illustrated preferred embodiment of FIG. 3A, the grinding step continues until the partial filler layer 14' which remains has an average thickness of only about one mil; however, as an alternative, that thickness preferably can range from one-half to two mils.

As a third modification, all of the steps which are illustrated in FIGS. 3A thru 5C have utility by themselves; and thus, those steps can be performed regardless of how the subassembly 10-1 of FIG. 3A is obtained. For example, if the lid 16 is somehow removed from the IC-package 10 by steps other than the sealant weakening step of FIG. 2A and the sealant cutting step of FIG. 2B, the resulting subassembly 10-1 can still be processed by the grinding step of FIG. 3A and the dissolving step of FIG. 4A and the disintegrating step of FIG. 5A. Similarly, the subassembly 10-3 of FIG. 4B can be processed by the disintegrating step of FIGS. 5A–5C regardless of how that subassembly was obtained.

As a fourth modification, the substrate 11 which is processed by the steps of FIGS. 2A–5C is not limited to being a ceramic substrate. Instead, as one particular alternative, the substrate 11 can be an organic laminate substrate.

As a fifth modification, the substrate 11 which is processed by the steps of FIGS. 2A–5C can be one that holds several of the IC-chips 12. Similarly, the substrate 11 which is processed by the step of FIGS. 2A–5C can be one which holds discrete electrical components, such as capacitors and resistors, in addition to one or more of the IC-chips 12. Any such discrete electrical components, which are simply soldered to the substrate and have no filler layer 14, preferably are cut off or alternatively removed from the substrate 11 before the grinding step of FIG. 3A.

As a sixth modification, the disintegrating step can be performed by the ultrasonic vibrator 51 which vibrates at just a single frequency or vibrates at multiple frequencies. For example, the ultrasonic vibrator 51 can generate vibrations which repeatedly sweep a range of frequencies. By generating the ultrasonic vibrations with multiple frequencies, standing waves with dead zones are avoided in the fluid 52 of FIG. 5A.

As a seventh modification, the partial filler layer 14' can be dissolved by various solvents other than Dynaloy Dynasolve 2000. For example, one particular alternative solvent is Dynaloy Dynasolve 2000 plus. These two solvents, and others, fall into the broader category of a caustic alkali organic liquid.

As an eighth modification, the seal 17 which connects the lid 15 to the substrate 11 can be weakened by soaking the seal in solvents other than Dynaloy Dynasolve 255. For example, the active ingredients in Dynaloy Dynasolve 255 include petroleum naphtha and dodecylbenzene sulfonic acid; and thus, various solvents which contain one or both of those active ingredients can be used.

Accordingly, it is to be understood that the scope of the present invention is not limited to just the details of the illustrated preferred process but is defined by the appended claims.

What is claimed is:

1. A process for recycling a substrate from an IC-package of the type in which—a) said substrate has a face with a plurality of I/O pads, b) an IC-chip is spaced-apart from said face and has a plurality of I/O pads that are aligned with said I/O pads on said substrate, c) respective solder balls connect said I/O pads on said substrate to said I/O pads on said IC-chip, and d) a filler layer fills the space between said substrate and said IC-chip and said solder balls; wherein said process includes the steps of:

grinding off of said substrate, said IC-chip in its entirety plus a first portion of said filler layer and a first portion of each solder ball to thereby leave a partial filler layer and partial solder balls on said substrate;

dissolving said partial filler layer off of said substrate after said grinding step; and, disintegrating off of said substrate after said dissolving step, at least part of each partial solder ball by subjecting each partial solder ball on said substrate to ultrasonic vibrations.

2. A process according to claim 1 wherein said I/O pads on said substrate include a metal which forms an intermetallic compound with said partial solder balls above a particular temperature, and wherein said disintegrating step is performed in its entirety below said particular temperature.

3. A process according to claim 1 wherein said disintegrating step is performed for only a predetermined time period after which a small solder mound from such partial solder ball remains connected to said I/O pads on said substrate.

4. A processing according to claim 3 wherein each solder mound has a volume of one-quarter to one-tenth of the corresponding partial solder ball.

5. A process according to claim 3 and further including the step of attaching said substrate to a new IC-chip, which has I/O pads that are connected to new solder balls, by reflowing said new solder balls into said solder mounds on said substrate.

6. A process according to claim 1 wherein said dissolving step is performed by bathing said partial filler layer on said substrate in a solvent which reacts chemically with said partial filler layer without etching said substrate and without etching said partial solder balls on said substrate.

7. A process according to claim 6 wherein said substrate is a ceramic substrate, said partial solder balls are a lead-tin mixture, and said partial filler layer is selected from the group of a cyanate ester and an epoxy.

8. A process according to claim 7 wherein said solvent includes the active ingredient of a caustic alkali organic liquid.

9. A process according to claim 1 wherein said IC-package further includes a lid which covers said IC-chip, and a sealant which attaches said lid to said substrate; and wherein, prior to said grinding step, said process further includes the steps of:

weakening said sealant, without penetrating thru said sealant, by soaking said IC-package in a liquid solvent; and, cutting through said sealant with a blade, after said weakening step.

10. A process according to claim 9 wherein said solvent for said weakening step includes an active ingredient that is selected from the group of petroleum naphtha and dodecylbenzene sulfonic acid.

11. A process for recycling a substrate from an IC-package of the type in which —a) said substrate has a face with a plurality of I/O pads, and b) respective partial solder balls are attached to said I/O pads on said substrate; wherein said process includes the step of:

disintegrating off of said substrate, only a portion of each partial solder ball by subjecting each partial solder ball on said substrate to ultrasonic vibrations for a predetermined time period after which a small solder mound from each partial solder ball remains connected to said I/O pads on said substrate; and, attaching said substrate, after said disintegrating step, to a new IC-chip, which has I/O pads that are connected to solder balls, by reflowing said new solder balls into said solder mounds on said substrate.

12. A process according to claim 11 wherein said I/O pads on said substrate include a metal which forms an intermetallic compound with said partial solder balls above a particular temperature, and wherein said disintegrating step is performed in its entirety below said particular temperature.

13. A process according to claim 11 wherein each solder mound has a volume of one-quarter to one-tenth of the corresponding partial solder ball.

* * * * *